US007301396B1

(12) United States Patent
Johnson et al.

(10) Patent No.: US 7,301,396 B1
(45) Date of Patent: Nov. 27, 2007

(54) SYSTEM AND METHOD FOR DISTORTION CANCELLATION IN AMPLIFIERS

(75) Inventors: Douglas M. Johnson, Doylestown, PA (US); Rajah V. Vysyaraju, Princeton, NJ (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 11/015,863

(22) Filed: Dec. 16, 2004

(51) Int. Cl.
*H03F 1/00* (2006.01)
*H03F 3/68* (2006.01)

(52) U.S. Cl. ........................................ 330/151; 330/295
(58) Field of Classification Search ...................... None
See application file for complete search history.

(56) References Cited

U.S. PATENT DOCUMENTS

| | | | | |
|---|---|---|---|---|
| 5,523,717 A | * | 6/1996 | Kimura | 330/252 |
| 5,608,352 A | * | 3/1997 | Itakura | 330/253 |
| 6,320,461 B1 | | 11/2001 | Lee | 330/52 |
| 6,509,796 B2 | * | 1/2003 | Nguyen et al. | 330/254 |
| 6,885,245 B2 | * | 4/2005 | Liu | 330/253 |
| 6,980,050 B2 | * | 12/2005 | Liu | 330/253 |
| 6,985,035 B1 | * | 1/2006 | Khorramabadi | 330/253 |

* cited by examiner

*Primary Examiner*—Robert Pascal
*Assistant Examiner*—Krista M Flanagan
(74) *Attorney, Agent, or Firm*—Morgan, Lewis & Bockius LLP

(57) ABSTRACT

A distortion cancellation amplifier is described having a main amplifier and an error amplifier. The main amplifier, in response to an input signal, generates an output signal having an amplified signal component and a distortion signal component. The error amplifier is sized and biased to generate, in response to the same input signal, a distortion signal component that has substantially the same magnitude as the distortion signal component of the main amplifier. The distortion signal component from the error amplifier is subtracted from the output signal of the main amplifier.

8 Claims, 7 Drawing Sheets

SYSTEM AND METHOD FOR DISTORTION CANCELLATION IN AMPLIFIERS

BACKGROUND OF THE INVENTION

1. Field of the Invention

The present invention relates to linear power amplifiers. More specifically, the invention relates to distortion cancellation in power amplifiers.

2. Description of the Related Art

Power amplifiers are critical components for all modern communication systems because they provide the power that enables the communication signal to propagate over the desired distances of the communication system. Communication systems are allocated defined portions of the frequency spectrum and these allocated portions, or bands, are a limited resource. Therefore, there is a strong economic incentive to use these bands as efficiently as possible by maximizing the amount of data transmitted per frequency range. Modulation techniques, such as quadrature amplitude modulation (QAM), or multi-carrier methods, such as orthogonal frequency division multiplex (OFDM), used for high data rate signals are very sensitive to signal distortion and require linear power amplifiers that do not distort the signal during the amplification process.

FIG. 1 is a schematic diagram illustrating the feed forward technique of distortion cancellation. In FIG. 1, an input signal, A, is split by splitter 105 into two portions, A1 and A2, that are directed into two paths. The lower path includes a delay line 110, a summer 130 and an error amplifier 150. The upper path includes a power amplifier 120, a coupler 140 and a delay line 160. An attenuator 145 supplies a portion of the signal from the upper path to summer 130 in the lower path; and the signals in the two paths are recombined by summer 165. In the upper path in FIG. 1, the signal exiting power amplifier 120 contains both an amplified portion of the input signal, K1A1, and distortion D generated by the nonlinearities of the power amplifier. A portion, $\alpha K1A1+\alpha D$, of the amplified signal is directed by directional coupler 140 along the upper path into delay line 160, which matches the delay caused by the error amplifier 150. The remaining portion, $\beta K1A1+\beta D$, of the amplified signal is directed by the directional coupler 140 into an attenuator 145. The attenuator 145 attenuates the amplified signal such that the its amplitude at the output of the attenuator matches that of signal A2. The input signal A2 diverted into the lower path of FIG. 1 is directed into a delay line 110. Delay line 110 is adjusted to compensate for the delay caused by the power amplifier 120, coupler 140, and attenuator 145 such that the output of the delay line arrives at the summer 130 at the same time as the attenuated signal from the attenuator. The delayed input signal is subtracted from the attenuated signal at the summer 130 such that the output signal of summer 130 is only an attenuated portion of the distortion signal. The distortion signal is amplified by the error amplifier 150 such that the amplitude and phase of the output of amplifier 150 matches the amplitude and phase of the distortion signal component of the signal exiting delay line 160. Summer 165 subtracts the amplified distortion signal from error amplifier 150 from the signal from delay line 160 leaving an output signal 111 that contains little or no distortion.

The feed forward design is susceptible to temperature variations and other factors and the delay lines must be carefully matched for wideband signals. Therefore, there remains a need for improving the linearity of power amplifiers by canceling the distortion caused by power amplifier nonlinearities.

SUMMARY OF THE INVENTION

One embodiment of the present invention is directed to a distortion cancellation amplifier, comprising: a main amplifier having a control terminal for receiving an input signal from an input port and a source terminal connected to an output port; an error amplifier having a control terminal for receiving the input signal from the input port and a source terminal; and an inverter connected between the source terminal of the error amplifier and the output port, wherein the error amplifier is sized to generate a distortion signal that substantially cancels a distortion component of an amplified output signal from the main amplifier after inversion of the distortion signal by the inverter.

Another embodiment of the present invention is directed to a method of canceling distortion in a linear power amplifier, comprising the steps of: receiving an input signal; amplifying the input signal via a main amplifier, the main amplifier generated an output signal comprising an amplified input signal and a distortion signal component; generating a distortion signal via an error amplifier, the distortion signal having substantially the same magnitude as the distortion signal component; and subtracting the distortion signal from the output signal.

Another embodiment of the present invention is directed to a distortion canceling differential amplifier comprising: a first input port for receiving a first input signal; a second input port for receiving a second input signal, the second input signal phase shifted by 180° from the first input signal; a first main transistor having a source terminal and a control terminal, the control terminal connected to the first input port and the source terminal providing a first main output signal to a first output port; a second main transistor having a source terminal and a control terminal, the control terminal connected to the second input port and the source terminal providing a second main output signal to a second output port; a first error transistor having a source terminal and a control terminal, the control terminal of the first error transistor connected to the first input port and the source terminal of the first error transistor providing a first error signal to the second output port; and a second error transistor having a source terminal and a control terminal, the control terminal of the second error transistor connected to the second input port and the source terminal of the second error transistor providing a second error signal to the first output port.

Another embodiment of the present invention is directed to a distortion cancellation amplifier, comprising: a main differential amplifier having a first input port, a second input port, a first output port, and a second output port; and an error differential amplifier having a first input port connected to the first input port of the main differential amplifier, a second input port connected to the second input port of the main differential amplifier, a first output port connected to the second output of the main differential amplifier, and a second output port connected to the first output port of the main differential amplifier, wherein the error differential amplifier is sized to generate a distortion signal having substantially the same amplitude as a distortion signal component generated by the main differential amplifier and an amplified input signal at least 20 db below an amplified input signal from the main differential amplifier.

BRIEF DESCRIPTION OF THE DRAWINGS

The invention will be described by reference to the preferred and alternative embodiments thereof in conjunction with the drawings in which.

DETAILED DESCRIPTION

A distortion cancellation amplifier is described having a main amplifier and an error amplifier. The main amplifier, in response to an input signal, generates an output signal having an amplified signal component and a distortion signal component. The error amplifier is sized and biased to generate, in response to the same input signal, a distortion signal component that has substantially the same magnitude as the distortion signal component of the main amplifier. The distortion signal component from the error amplifier is subtracted from the output signal of the main amplifier.

Figure 1:
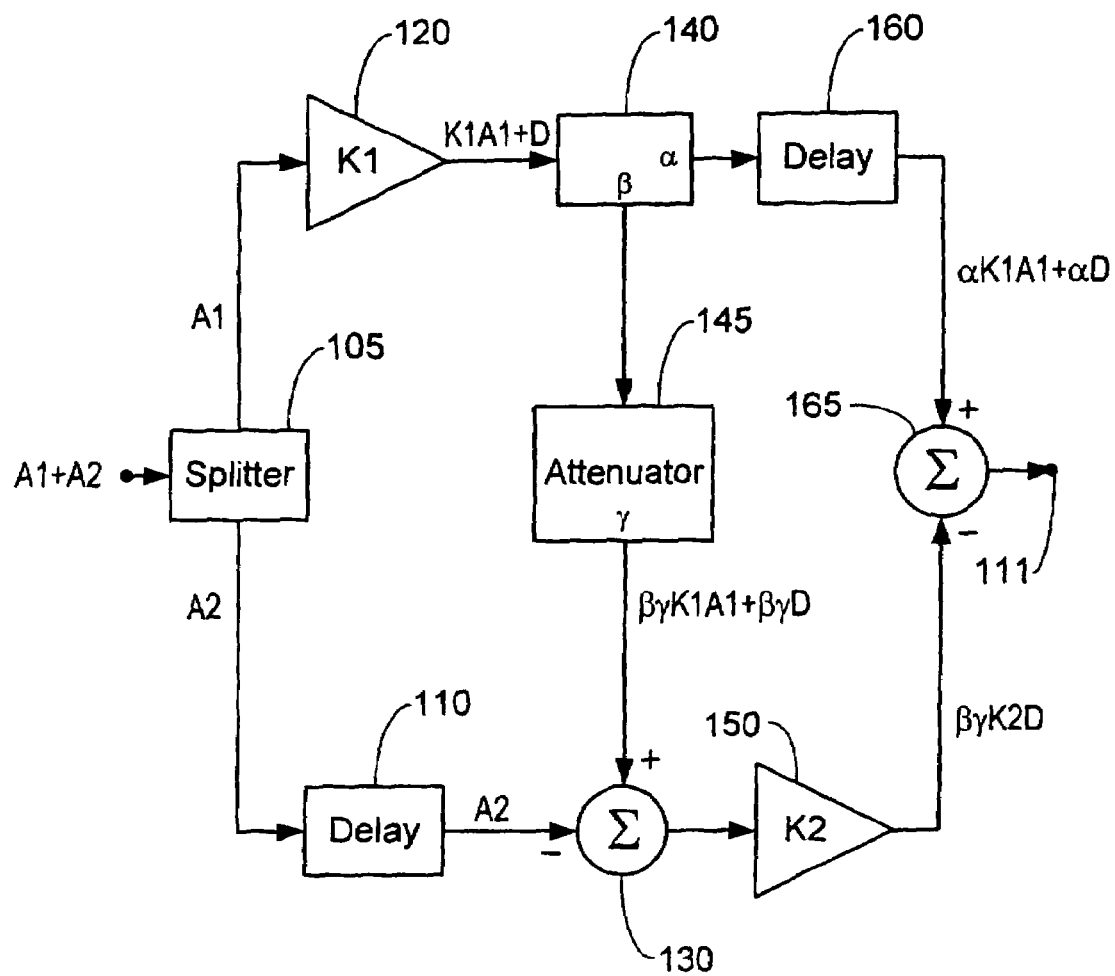
FIG. 1 is a schematic diagram illustrating the feed forward technique of distortion cancellation.
Figure 2:
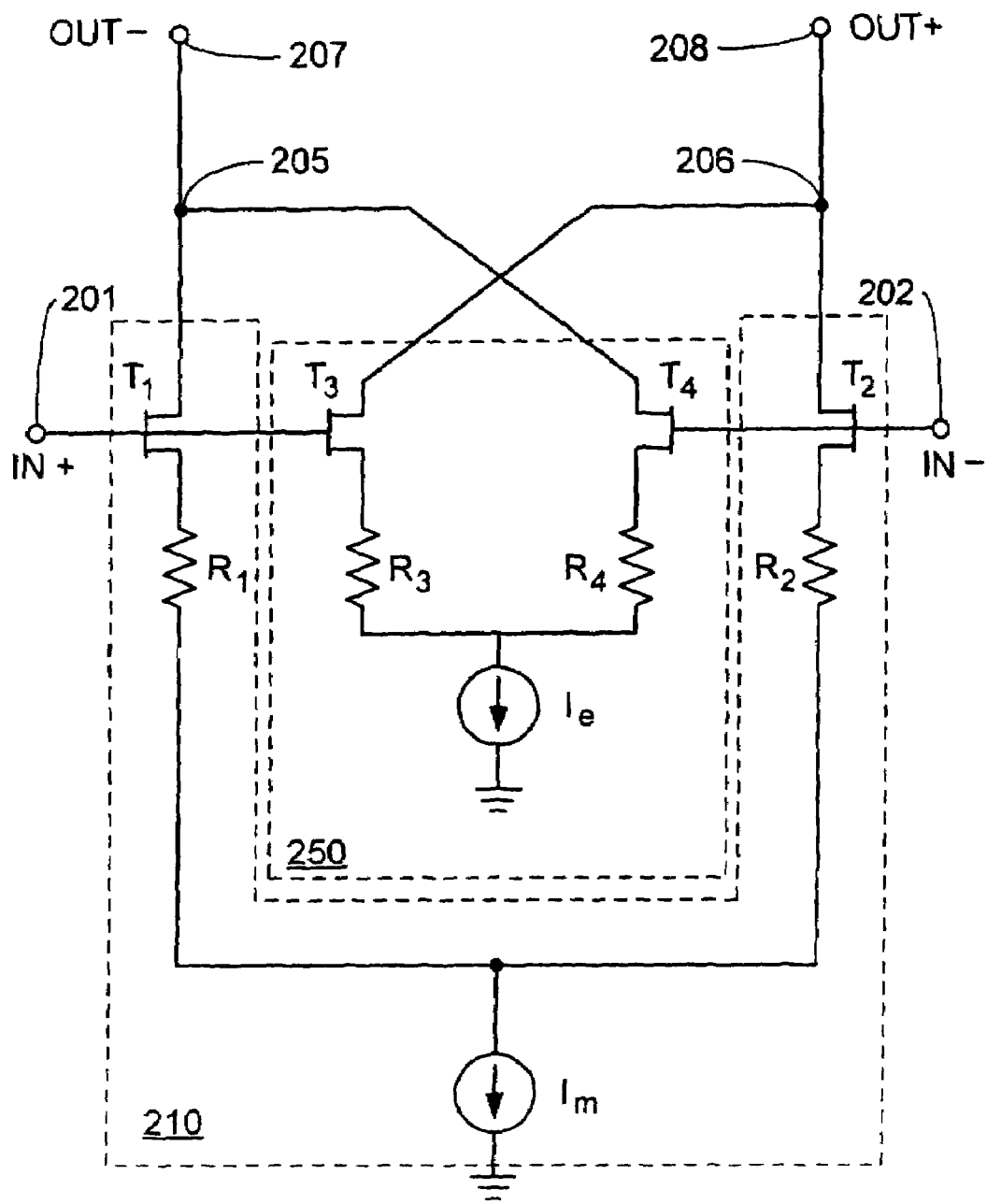
FIG. 2 is a schematic diagram illustrating one embodiment of the present invention.

FIG. 2 is a schematic diagram illustrating one embodiment 200 of the present invention. FIG. 2 shows a differential amplifier 210 with a cross-coupled differential error amplifier 250. Although FIG. 2 shows the use of a field effect transistor (FET), preferably a MESFET, it should also be recognized that a bipolar transistor (BJT) or a heterojunction bipolar transistor (HBT) may also be used and are within the scope of the present invention. As used herein, a control terminal of a transistor refers to a gate terminal of a FET or a base terminal of a BJT or HBT. Similarly, a source terminal of a transistor refers to a collector terminal of a bipolar transistor or a drain terminal of a FET and a sink terminal of a transistor refers to an emitter terminal of a bipolar transistor or a source terminal of a FET.

In FIG. 2, transistors T1 and T2 form a balanced main differential amplifier and transistors T3 and T4 form a balanced error differential amplifier 250. A first input port 201 provides a first input signal, IN+, to a control terminal of T1 and T3. Similarly, a second input port 202 provides a second input signal, IN−, that is 180° out of phase with IN+ to a control terminal of T2 and T4. A source terminal of T3 is connected to a source terminal of T2 at node 206 and a source terminal of T4 is connected to a source terminal of T1 at node 205, thereby cross-coupling the main amplifier to the error amplifier 250. A first output port 207 is connected to node 205 and provides a first output signal, OUT−, to a first external load that is not shown. A second output port 208 is connected to node 206 and provides a second output signal, OUT+, to a second external load that is not shown. Resistors R1 and R2, along with current source Im, are selected to bias transistors T1 and T2. Similarly, resistors R3 and R4, along with current source, Ie, are selected to bias transistors T3 and T4.

The cross-coupling of the main amplifier to the error amplifier 250 causes a summed signal at the output ports 207 and 208 to be the difference of an amplified main signal and an amplified error signal. The amplified main signal generated by T1 and T2 includes an amplified input signal component and a distortion component. In a preferred embodiment, the amplified error signal generated by T3 and T4 includes a relatively small input signal component and a distortion component. The distortion component of T1 preferably has about the same magnitude as the distortion component of the T4 amplified signal but is 180° out of phase. Similarly, the distortion component of T2 has about the same magnitude as the distortion component of the T3 amplified signal but is 180° out of phase. At the first output port 207, the distortion component of the T4 signal cancels the distortion component of the T1 signal, leaving a slightly attenuated amplified input signal from T1. Similarly, at the second output port 208, the distortion component of the T3 signal cancels the distortion component of the T2 signal, leaving a slightly attenuated amplified signal from T2. The slight attenuation of the amplified input signals at the output ports arise from the relatively small input signal component in the amplified error signals from T3 and T4. In a preferred embodiment, the relatively small input signal component in the amplified error signals from T3 and T4 is at least 20 db below the amplified input signals from T1 and T2.

Figure 3:
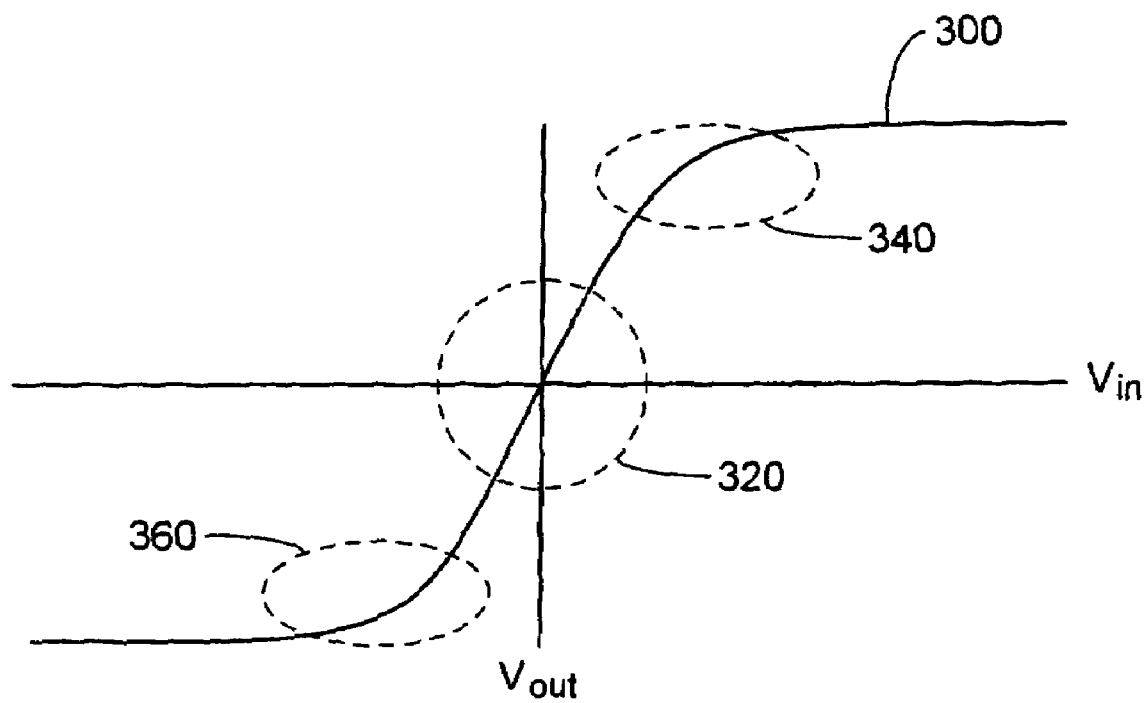
FIG. 3 is a diagram illustrating an input-output characteristic of the embodiments shown in FIG. 2.

The error amplifier transistors, T3 and T4, are designed and operated such that they generate distortion components having approximately the same magnitude as the distortion components from T1 and T2. FIG. 3 is an illustrative example of the output versus input characteristic of a differential amplifier. In FIG. 3, output voltage as a function of input voltage of a differential amplifier is shown by line 300. Line 300 has a linear region 320 where an output voltage varies linearly with an input voltage with the slope of line 300 proportional to the voltage gain of the amplifier. Regions 340 and 360 indicate nonlinear regions where the output voltage does not vary linearly with the input voltage. FIG. 3 indicates that the voltage gain in nonlinear regions 340 and 360 is less than the voltage gain in the linear region 320.

In a preferred embodiment, the main amplifier such as that shown in FIG. 2 is simulated using existing MESFET nonlinear models for T1 and T2 with a nonlinear simulation software such as, for example, Advanced Design System (ADS) available from Agilent Technologies, Inc. of Palo Alto, Calif. although other nonlinear simulation software may also be used. In the simulation, distortion products of the main amplifier are first estimated. Distortion products may be mainly the odd order intermodulation products containing the amplified signal. An error amplifier is then simulated over a range of FET sizes, degeneration resistors (R3-R4 in FIG. 2), and bias currents (Ie in FIG. 2) until an output of the error amplifier has a fundamental that is at least 10 db, preferably 20 db, below a desired signal but with a distortion signal that has substantially the same amplitude as a distortion signal component from the main amplifier such that the output of the error amplifier cancels the distortion component of the main amplifier without substantially decreasing the amplified input signal at the fundamental. A bench circuit may be fabricated based on the simulation results and further improvements may be achieved with additional adjustments of the error amplifier bias current, Ie.

Figure 4:
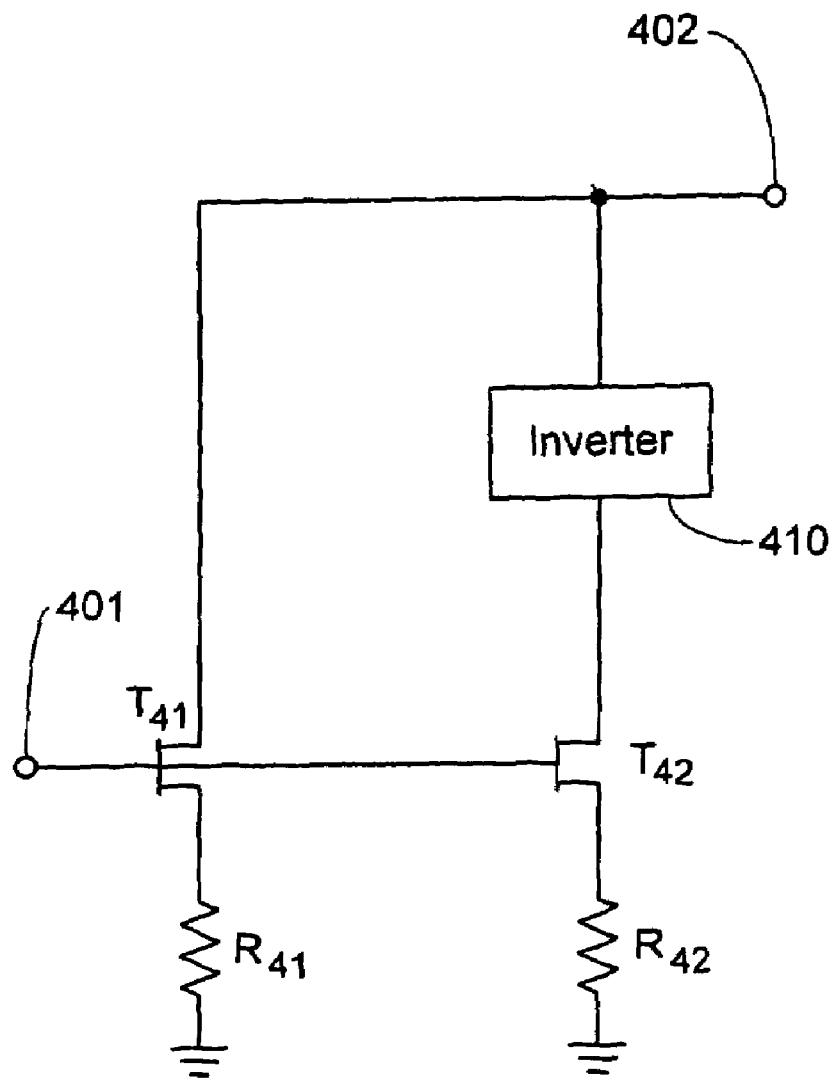
FIG. 4 is a schematic diagram illustrating another embodiment of the present invention.

FIG. 4 is a schematic diagram illustrating another embodiment 400 of the present invention. In FIG. 4, a single ended amplifier 400 is shown having an input port 401 and an output port 402. Input port 401 receives an input signal, which is presented to a control terminal of an amplifying transistor T41 and to a control terminal of an error transistor T42. A source terminal of T41 is connected to the output port 402. A source terminal of the error transistor T42 is connected to the output port 402 through an inverter 410. The inverter 410 phase shifts a distortion signal from the error transistor T42 by 180° such that the distortion signal from the error transistor T42 substantially cancels a distortion component of an amplified signal from the main transistor T41, thereby leaving a substantially distortion free amplified signal at the output port 402. Sink resistor R41 connects a sink terminal of the main transistor T41 to a ground and may be selected to set a bias point of T41. Sink resistor R42 connects a sink terminal of the error transistor T42 to a ground and may be selected to set a bias point of T42. A current source (not shown) may also be added in series to each sink resistor to further control the bias point of each transistor.

The size of the error transistor T42 and a value for sink resistors R41 and R42 may be selected based on circuit simulations using nonlinear simulation software as described previously. Further optimization of distortion cancellation may be done after fabrication by adjusting the current source for the error transistor.

Figure 5:
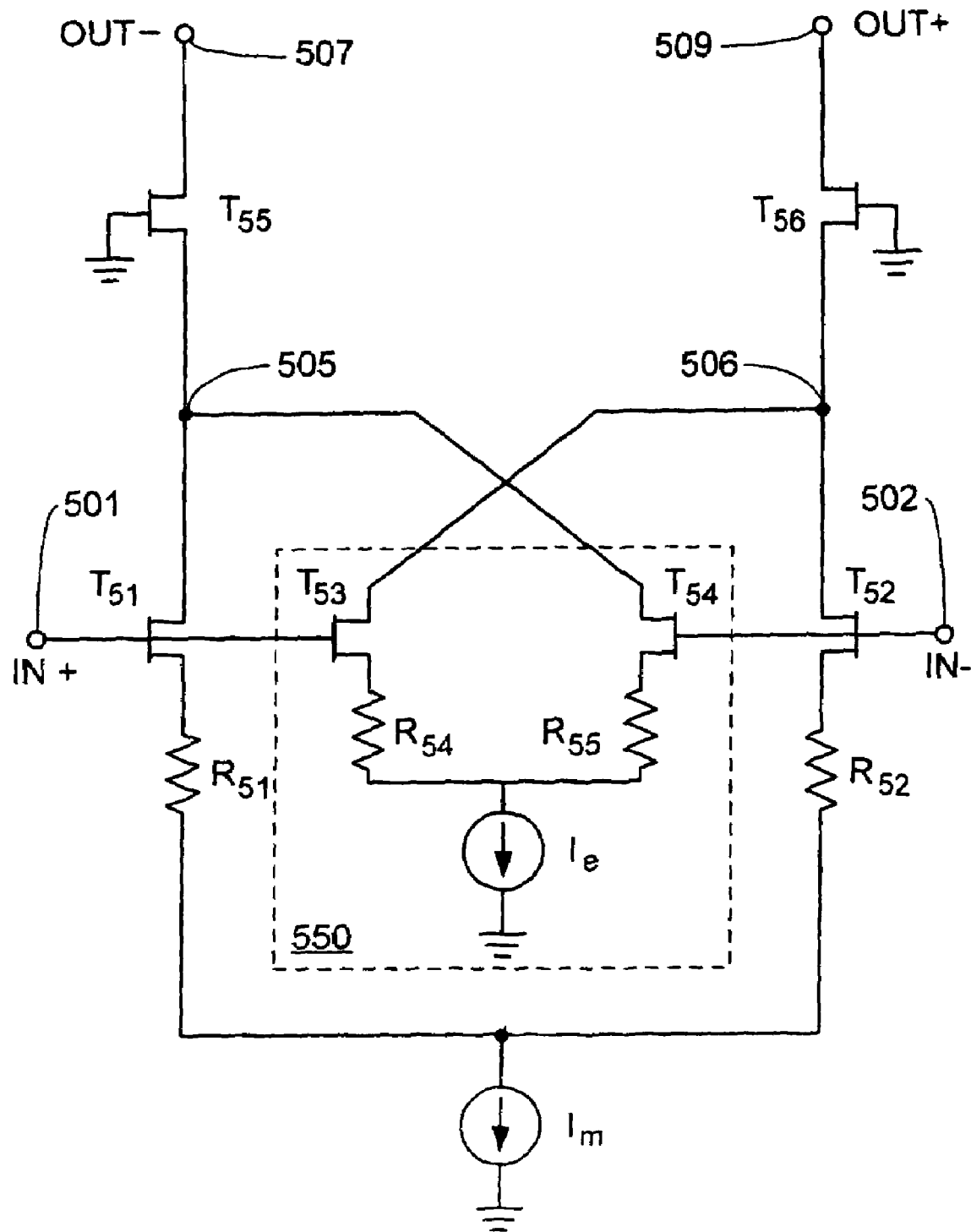
FIG. 5 is a schematic diagram illustrating another embodiment of the present invention.

FIG. 5 is a schematic diagram illustrating another embodiment 500 of the present invention. In FIG. 5, transistors T51, T52, T55, and T56 form a balanced main differential cascode amplifier and transistors T53 and T54 form a balanced differential error amplifier 550. The main cascode amplifier may provide improved linearity of the linear region 320 compared to the main amplifier of FIG. 2. A first input port 501 provides a first input signal, IN+, to a control terminal of a first main transistor, T51, and a first error transistor, T53. Similarly, a second input port 502 provides a second input signal, IN−, that is 180° out of phase with IN+ to a control terminal of a second main transistor, T52, and a second error transistor, T54. An input port of cascode transistors T55 and T56 is AC grounded. A source terminal of T53 is connected to a source terminal of T52 at node 506 and a source terminal of T54 is connected to a source terminal of T51 at node 505, thereby cross-coupling the main amplifier to the error amplifier 550. A first output port 507 is connected to node 505 through a first cascode transistor T55 and provides a first output signal, OUT−, to a first external load that is not shown. The first output signal, OUT−, is the sum of a first main output signal provided by the source terminal of T51 and a second error signal provided by the source terminal of T54. A second output port 509 is connected to node 506 through a second cascode transistor T56 and provides a second output signal, OUT+, to a second external load that is not shown. Resistors R51 and R52, along with current source, Im, are selected to bias transistors T51 and T52. Similarly, resistors R54 and R55 along with current source, Ie, are selected to bias transistors T53 and T54.

The cross-coupling of the main amplifier to the error amplifier 550 causes a summed signal at the output ports 507 and 509 to be the difference of an amplified main signal and an amplified error signal. The amplified main signal for T51 and T52 includes an amplified input signal component and a distortion component. In a preferred embodiment, the amplified error signal for T53 and T54 includes a relatively small input signal component and a distortion component. The distortion component of T51 preferably has about the same magnitude as the distortion component of the T54 amplified signal but is 180° out of phase. Similarly, the distortion component of T52 has about the same magnitude as the distortion component of the T53 amplified signal but is 180° out of phase. At the first output port 507, the distortion component of the T54 signal cancels the distortion component of the T51 signal, leaving a slightly attenuated amplified signal from T51. Similarly, at the second output port 509, the distortion component of the T53 signal cancels the distortion component of the T52 signal, leaving a slightly attenuated amplified signal from T52. The slight attenuation of the amplified input signals at the output ports arise from the relatively small input signal component in the amplified error signals from T53 and T54. In a preferred embodiment, the relatively small input signal component in the amplified error signals from T53 and T54 is at least 20 db below the amplified input signals from T51 and T52.

Error amplifier 550 is designed, sized, and operated such that it generates distortion components having approximately the same magnitude as the distortion components generated by the main amplifier. In a preferred embodiment, a main amplifier such as that shown in FIG. 5 is simulated using existing MESFET nonlinear models for T51 and T52 with a nonlinear simulation software such as, for example, ADS although other nonlinear simulation software may also used. In the simulation, distortion products of the main amplifier are first estimated. Distortion products may be mainly the odd order intermodulation products containing the amplified signal. An error amplifier is then simulated over a range of FET sizes, degeneration resistors (R54-R55 in FIG. 5), and bias currents (Ie in FIG. 5) until an output of the error amplifier has a fundamental that is at least 10 db, preferably 20 db, below a desired signal but with a distortion signal that has substantially the same amplitude as a distortion signal component from the main amplifier such that the output of the error amplifier cancels the distortion component of the main amplifier without substantially decreasing the amplified input signal at the fundamental. A bench circuit may be fabricated based on the simulation results and further improvements may be achieved with additional adjustments of the error amplifier bias current.

Figure 6:
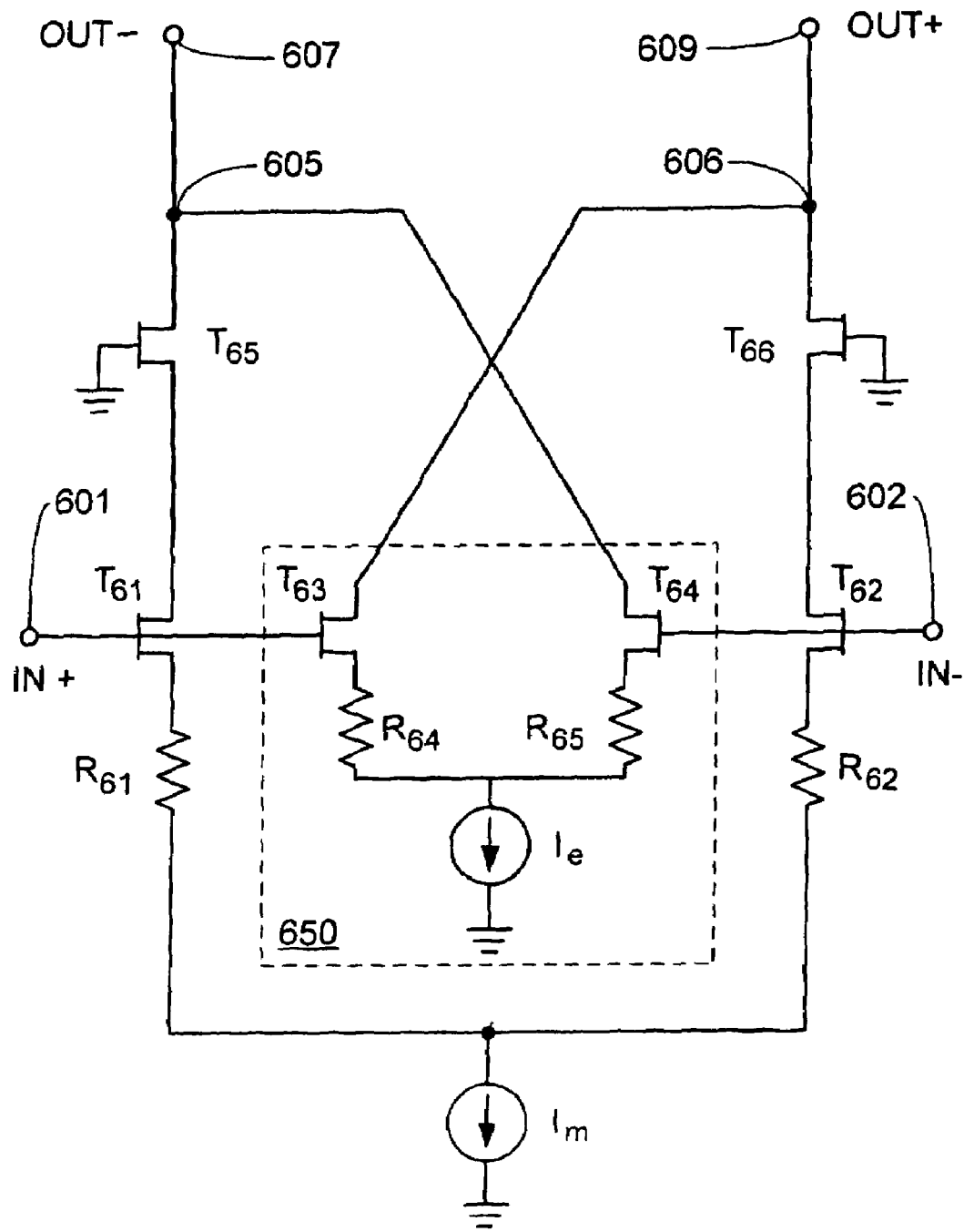
FIG. 6 is a schematic diagram illustrating another embodiment of the present invention.

FIG. 6 is a schematic diagram illustrating another embodiment 600 of the present invention. In FIG. 6, transistors T61, T62, T65, and T66 form a balanced main differential cascode amplifier and transistors T63 and T64 form a balanced differential error amplifier 650. A first input port 601 provides a first input signal, IN+, to a control terminal of a first main transistor, T61, and a first error transistor, T63. Similarly, a second input port 602 provides a second input signal, IN−, that is 180□ out of phase with IN+ to a control terminal of a second main transistor, T62, and a second error transistor, T64. An input port of cascode transistors T65 and T66 is AC grounded. A first output port 607 is connected to a source terminal of T64 and to a source terminal of a first cascode transistor, T65, at node 605 and provides a first output signal, OUT−, to a first external load that is not shown. A second output port 609, connected to a source terminal of T63 and to a source terminal of a second cascode transistor, T66, at node 606, provides a second output signal, OUT+, to a second external load that is not shown, thereby cross-coupling the main amplifier to the error amplifier 650. A sink terminal of first cascode transistor T65 is connected to a source terminal of T61. A sink terminal of second cascode transistor T66 is connected to a source terminal of T62. The first output signal, OUT+, is the sum of a first main output signal provided by the source terminal of T61 and a second error signal provided by the source terminal of T64. The second output signal, OUT+, is the sum of a second main output signal provided by the source terminal of T62 and a first error signal provided by the source terminal of T63. Resistors R61 and R62 along with current source, Im, are selected to bias transistors T61 and T62. Similarly, resistors R64 and R65, along with current source, Ie, are selected to bias transistors T63 and T64.

The cross-coupling of the main amplifier to the error amplifier 650 causes a summed signal at the output ports 607 and 609 to be the difference of an amplified main signal and an amplified error signal. The amplified main signal for T61 and T62 includes an amplified input signal component and a distortion component. In a preferred embodiment, the amplified error signal for T63 and T64 includes a relatively small input signal component and a distortion component. The distortion component of T61 preferably has about the same magnitude as the distortion component of the T64 amplified signal but is 180° out of phase. Similarly, the distortion component of T62 has about the same magnitude as the distortion component of the T63 amplified signal but is 180° out of phase. At the first output port 607, the distortion component of the T64 signal cancels the distortion component of the T61 signal, leaving a slightly attenuated amplified input signal from T61. Similarly, at the second output port 609, the distortion component of the T63 signal cancels the distortion component of the T62 signal, leaving a slightly attenuated amplified input signal from T62. The slight attenuation of the amplified input signals at the output ports arise from the relatively small input signal component in the amplified error signals from T63 and T64. In a preferred embodiment, the relatively small input signal component in the amplified error signals from T63 and T64 is at least 20 db below the amplified input signals from T61 and T62.

In a preferred embodiment, a main amplifier such as that shown in FIG. 6 is simulated using existing MESFET nonlinear models for T61 and T62 with a nonlinear simulation software such as, for example, ADS although other nonlinear simulation software may also used. In the simulation, distortion products of the main amplifier are first estimated. Distortion products may be mainly the odd order intermodulation products containing an amplified signal. An error amplifier is then simulated over a range of FET sizes, degeneration resistors (R64-R65 in FIG. 6), and bias currents (Ie in FIG. 6) until an output of the error amplifier has a fundamental that is at least 10 db, preferably 20 db, below a desired signal but with a distortion signal that has substantially the same amplitude as a distortion signal component from the main amplifier such that the output of the error amplifier cancels the distortion component of the main amplifier without substantially decreasing the amplified input signal at the fundamental. A bench circuit may be fabricated based on the simulation results and further improvements may be achieved with additional adjustments of the error amplifier bias current.

Figure 7:
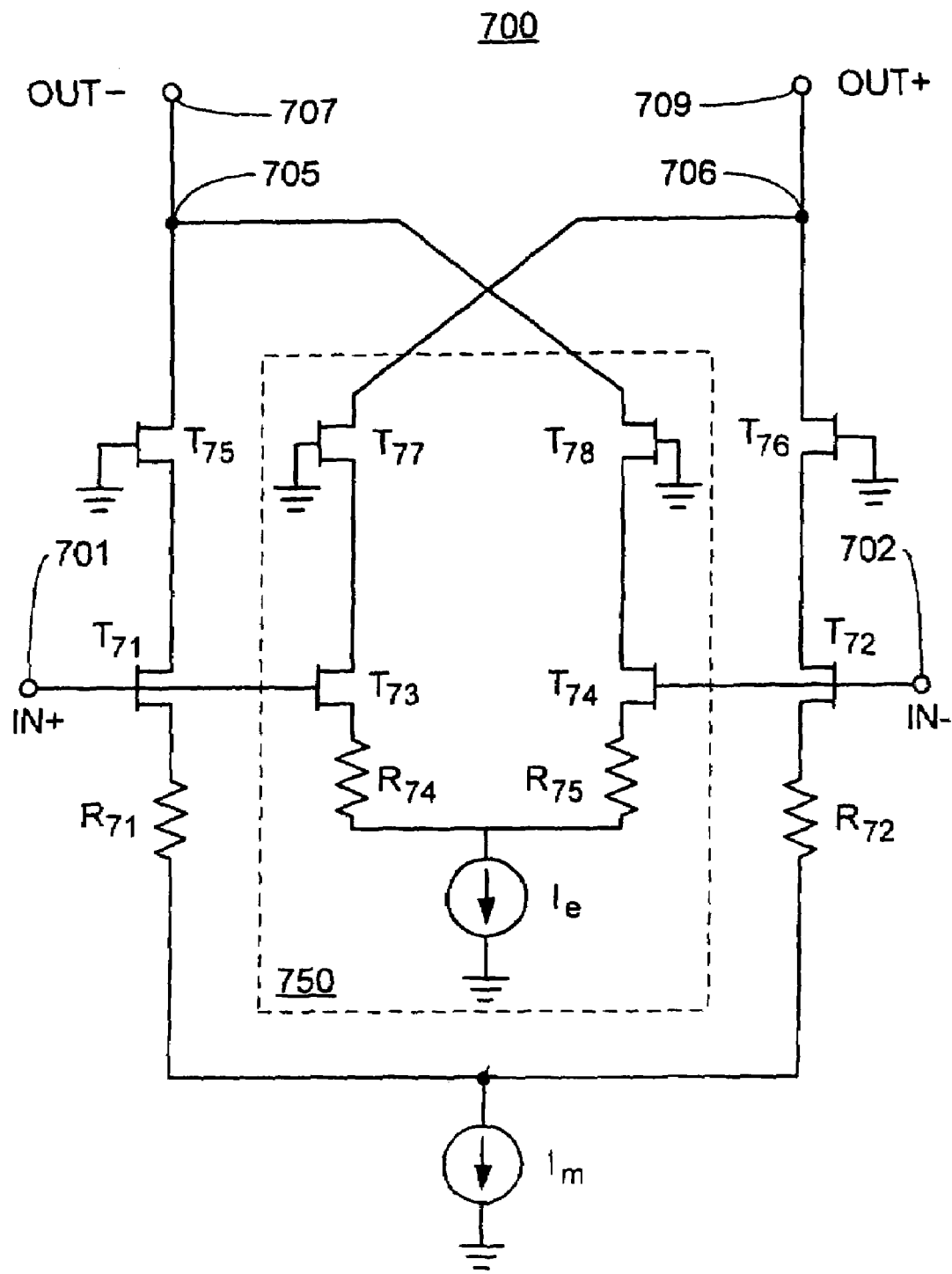
FIG. 7 is a schematic diagram illustrating another embodiment of the present invention.

FIG. 7 is a schematic diagram illustrating another embodiment 700 of the present invention. In FIG. 7, transistors T71, T72, T75, and T76 form a balanced main differential cascode amplifier. Transistors T73, T74, T77, and T78 form a balanced error differential cascode amplifier 750. A first input port 701 provides a first input signal, IN+, to a control terminal of T71 and T73. Similarly, a second input port 702 provides a second input signal, IN−, that is 180° out of phase with IN+ to a control terminal of T72 and T74. An input port of cascode transistors T75, T76, T77, and T78 is AC grounded. A source terminal of a third cascode transistor T77 is connected to a source terminal of a second cascode transistor T76 at node 706. A source terminal of a fourth cascode transistor T78 is connected to a source terminal of a first cascode transistor T75 at node 705, thereby cross-coupling the main cascode amplifier to the error cascode amplifier 750. A sink terminal of T75 is connected to a source terminal of T71 and a sink terminal of T76 is connected to a source terminal of T72. A sink terminal of T77 is connected to a source terminal of T73 and a sink terminal of T78 is connected to a source terminal of T74. A first output port 707 is connected to node 705 and provides a first output signal, OUT−, to a first external load that is not shown. A second output port 709 is connected to node 706 and provides a second output signal, OUT+, to a second external load that is not shown. Resistors R71 and R72, along with current source, Im, are selected to bias transistors T71 and T72. Similarly, resistors R74 and R75, along with current source, Ie, are selected to bias transistors T73 and T74.

The cross-coupling of the main cascode amplifier to error amplifier 750 causes a summed signal at the output ports 707 and 709 to be the difference of an amplified main signal and an amplified error signal. The amplified main signal for T71 and T72 includes an amplified input signal component and a distortion component. In a preferred embodiment, the amplified error signal for T73 and T74 includes a relatively small input signal component and a distortion component. The distortion component of T71 preferably has about the same magnitude as the distortion component of the T74 amplified signal but is 180° out of phase. Similarly, the distortion component of T72 has about the same magnitude as the distortion component of the T73 amplified signal but is 180° out of phase. At the first output port 707, the distortion component of the T74 signal cancels the distortion component of the T71 signal, leaving a slightly attenuated amplified input signal from T71. Similarly, at the second output port 709, the distortion component of the T73 signal cancels the distortion component of the T72 signal, leaving a slightly attenuated amplified input signal from T72. The slight attenuation of the amplified input signals at the output ports arise from the relatively small input signal component in the amplified error signals from T73 and T74. In a preferred embodiment, the relatively small input signal component in the amplified error signals from T73 and T74 is at least 20 db below the amplified input signals from T71 and T72.

In a preferred embodiment, a main amplifier such as that shown in FIG. 7 is simulated using existing MESFET nonlinear models for T71 and T72 with a nonlinear simulation software such as, for example, ADS although other nonlinear simulation software may also used. In the simulation, distortion products of the main amplifier are first estimated. Distortion products may be mainly the odd order intermodulation products containing an amplified signal. An error amplifier is then simulated over a range of FET sizes, degeneration resistors (R74-R75 in FIG. 7), and bias currents (Ie in FIG. 7) until an output of the error amplifier has a fundamental that is at least 10 db, preferably 20 db, below a desired signal but with a distortion signal that has substantially the same amplitude as a distortion signal component from the main amplifier such that the output of the error amplifier cancels the distortion component of the main amplifier without substantially decreasing the amplified input signal at the fundamental. A bench circuit may be fabricated based on the simulation results and further improvements may be achieved with additional adjustments of the error amplifier bias current.

Having thus described at least illustrative embodiments of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed is:

1. A distortion cancellation amplifier, comprising:
   a main amplifier having a control terminal for receiving an input signal from an input port and a source terminal connected to an output port;
   an error amplifier having a control terminal for receiving the input signal from the input port and a source terminal; and
   an inverter connected between the source terminal of the error amplifier and the output port, wherein the error amplifier is sized to generate a distortion signal that substantially cancels a distortion component of an amplified output signal from the main amplifier after inversion of the distortion signal by the inverter.

2. The distortion cancellation amplifier of claim 1 wherein the error amplifier further includes an adjustable current source.

3. The distortion cancellation amplifier of claim 1 wherein the main amplifier is a cascode amplifier.

4. The distortion cancellation amplifier of claim 1 wherein the main amplifier, error amplifier, and inverter of the distortion cancellation amplifier are fabricated on the same die.

5. A distortion canceling differential amplifier comprising:
a first input port for receiving a first input signal;
a second input port for receiving a second input signal, the second input signal phase shifted by 180° from the first input signal;
a first main transistor having a source terminal and a control terminal, the control terminal connected to the first input port and the source terminal providing a first main output signal to a first output port;
a second main transistor having a source terminal and a control terminal, the control terminal connected to the second input port and the source terminal providing a second main output signal to a second output port;
a first error transistor having a source terminal and a control terminal, the control terminal of the first error transistor connected to the first input port and the source terminal of the first error transistor providing a first error signal to the second output port;
a second error transistor having a source terminal and a control terminal, the control terminal of the second error transistor connected to the second input port and the source terminal of the second error transistor providing a second error signal to the first output port;
a first cascode transistor having a source terminal and a sink terminal, the source terminal of the first cascode transistor connected to the first output port and to the source terminal of the second error transistor, the sink terminal of the first cascode transistor connected to the source terminal of the first main transistor; and
a second cascode transistor having a source terminal and a sink terminal, the source terminal of the second cascode transistor connected to the second output port and to the source terminal of the first error transistor, the sink terminal of the second cascode transistor connected to the source terminal of the second main transistor.

6. A distortion canceling differential amplifier comprising:
a first input port for receiving a first input signal;
a second input port for receiving a second input signal, the second input signal phase shifted by 180° from the first input signal;
a first main transistor having a source terminal and a control terminal, the control terminal connected to the first input port and the source terminal providing a first main output signal to a first output port;
a second main transistor having a source terminal and a control terminal, the control terminal connected to the second input port and the source terminal providing a second main output signal to a second output port;
a first error transistor having a source terminal and a control terminal, the control terminal of the first error transistor connected to the first input port and the source terminal of the first error transistor providing a first error signal to the second output port;
a second error transistor having a source terminal and a control terminal, the control terminal of the second error transistor connected to the second input port and the source terminal of the second error transistor providing a second error signal to the first output port;
a first cascode transistor having a source terminal and a sink terminal, the source terminal of the first cascode transistor connected to the first output port, the sink terminal of the first cascode transistor connected to the source terminal of the first main transistor and to the source terminal of the second error transistor; and
a second cascode transistor having a source terminal and a sink terminal, the source terminal of the second cascode transistor connected to the second output port, the sink terminal of the second cascode transistor connected to the source terminal of the second main transistor and to the source terminal of the first error transistor.

7. A distortion cancellation amplifier, comprising:
a main differential amplifier having a first input port, a second input port, a first output port, and a second output port; and
an error differential amplifier having a first input port connected to the first input port of the main differential amplifier, a second input port connected to the second input port of the main differential amplifier, a first output port connected to the second output port of the main differential amplifier, and a second output port connected to the first output port of the main differential amplifier,
wherein the error differential amplifier is sized to generate a distortion signal having substantially the same amplitude as a distortion signal component generated by the main differential amplifier and an amplified input signal at least 20 db below an amplified input signal from the main differential amplifier; and
wherein the main differential amplifier is a differential cascode amplifier.

8. A distortion cancellation amplifier, comprising:
a main differential amplifier having a first input port, a second input port, a first output port, and a second output port; and
an error differential amplifier having a first input port connected to the first input port of the main differential amplifier, a second input port connected to the second input port of the main differential amplifier, a first output port connected to the second output port of the main differential amplifier, and a second output port connected to the first output port of the main differential amplifier,
wherein the error differential amplifier is sized to generate a distortion signal having substantially the same amplitude as a distortion signal component generated by the main differential amplifier and an amplified input signal at least 20 db below an amplified input signal from the main differential amplifier; and
wherein the error differential amplifier is a differential cascode amplifier.

* * * * *